(12) United States Patent
Akita et al.

(10) Patent No.: US 10,257,795 B2
(45) Date of Patent: Apr. 9, 2019

(54) SIGNAL CONVERSION APPARATUS, SIGNAL RESTORATION APPARATUS AND INFORMATION PROCESSING APPARATUS

(71) Applicant: KABUSHIKI KAISHA TOSHIBA, Minato-ku, Tokyo (JP)

(72) Inventors: Koji Akita, Yokohama Kanagawa (JP); Yukako Tsutsumi, Kawasaki Kanagawa (JP); Hidenori Okuni, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 189 days.

(21) Appl. No.: 14/723,825

(22) Filed: May 28, 2015

(65) Prior Publication Data

US 2015/0351057 A1    Dec. 3, 2015

(30) Foreign Application Priority Data

May 28, 2014 (JP) .................... 2014-110395

(51) Int. Cl.
*H04J 3/06* (2006.01)
*H04W 56/00* (2009.01)
(Continued)

(52) U.S. Cl.
CPC .......... *H04W 56/001* (2013.01); *H03M 9/00* (2013.01); *H04J 3/047* (2013.01); *H04J 3/0605* (2013.01); *H04J 3/0685* (2013.01)

(58) Field of Classification Search
None
See application file for complete search history.

(56) References Cited

U.S. PATENT DOCUMENTS

| 4,815,109 A * | 3/1989 | Kao ................. H04J 3/062 331/1 A |
| 6,477,184 B1 | 11/2002 | Ishikawa |

(Continued)

FOREIGN PATENT DOCUMENTS

| JP | 62086748 U | 6/1987 |
| JP | 09073388 A | 3/1997 |

(Continued)

OTHER PUBLICATIONS

Japanese Office Action dated Jun. 27, 2017 issued in counterpart Japanese Application No. 2014-110395.

*Primary Examiner* — Willie J Daniel, Jr.
(74) *Attorney, Agent, or Firm* — Holtz, Holtz & Volek PC

(57) ABSTRACT

According to an embodiment, a signal conversion apparatus includes a control information generator and a selector. The control information generator generates first control information based on rate information indicating transmission rates of original signals. The first control information designates a first timing at which each of the original signals is sampled. The selector selects each of the sampled signals at a timing based on the first timing. The original signal group includes a first original signal at a first transmission rate and a second original signal at a second transmission rate. The first transmission rate is higher than the second transmission rate. The frequency of allocating the first timing to the first original signal is higher than a frequency of allocating the first timing to the second original signal.

19 Claims, 12 Drawing Sheets

(51) Int. Cl.
*H03M 9/00* (2006.01)
*H04J 3/04* (2006.01)

(56) References Cited

U.S. PATENT DOCUMENTS

| | | | |
|---|---|---|---|
| 6,493,361 B1 * | 12/2002 | Yamaguchi | H04N 7/085 348/476 |
| 7,058,150 B2 * | 6/2006 | Buchwald | H03L 7/0814 370/307 |
| 2003/0012297 A1 | 1/2003 | Imamura | |
| 2014/0334584 A1 * | 11/2014 | Lakkis | H03L 7/07 375/376 |

FOREIGN PATENT DOCUMENTS

| | | | |
|---|---|---|---|
| JP | 10322298 A | 12/1998 | |
| JP | 2001313623 A | 11/2001 | |
| JP | 2010191861 A | 9/2010 | |

* cited by examiner

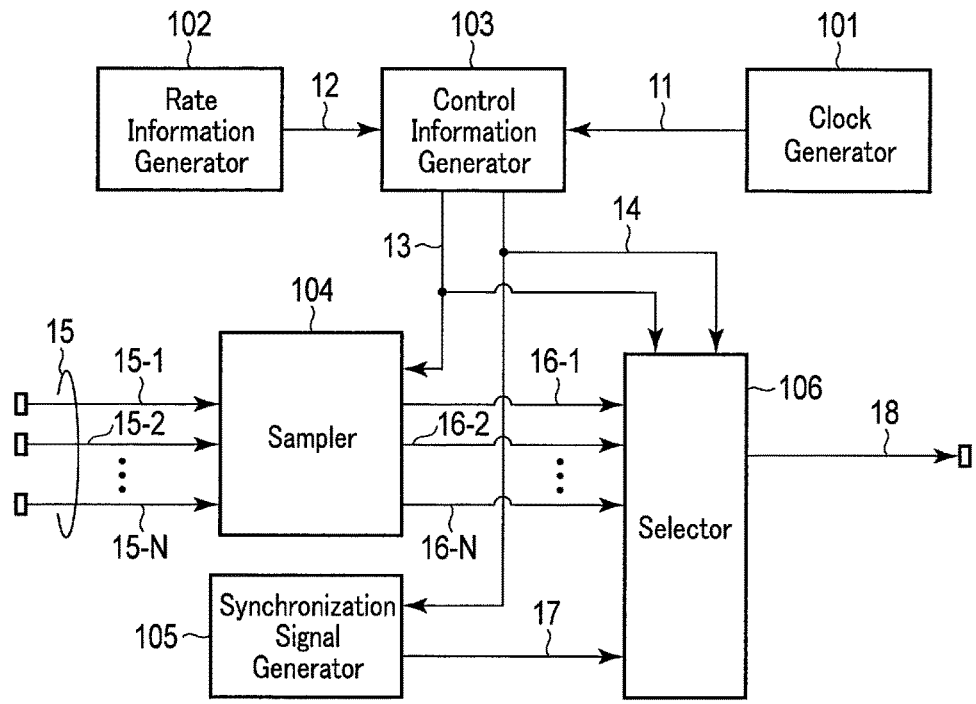
F I G. 1
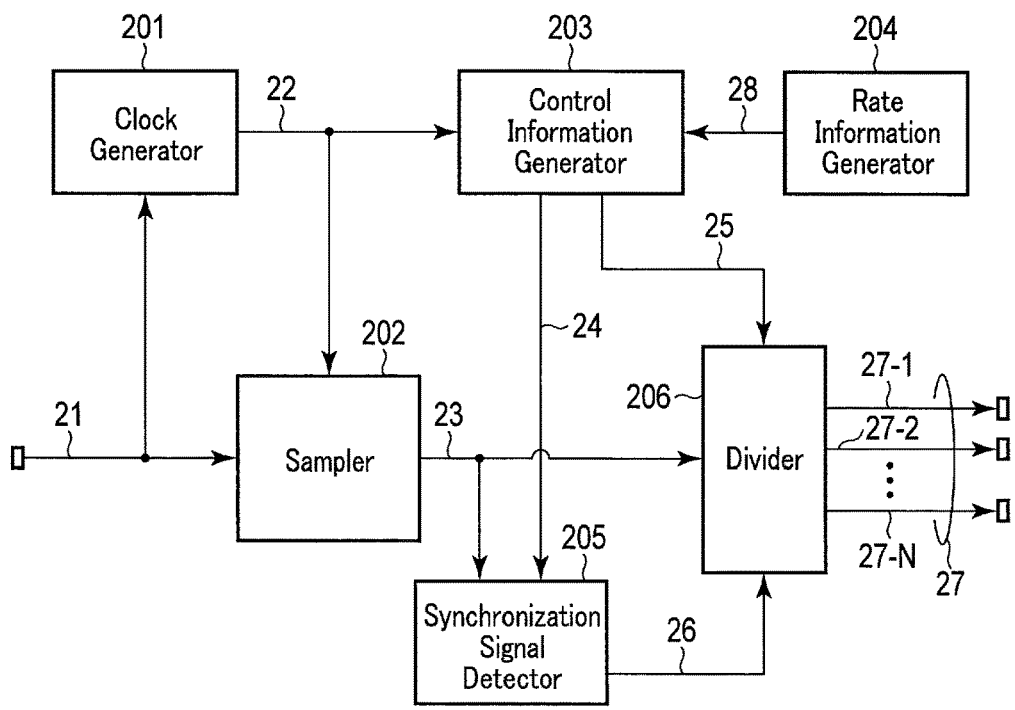
F I G. 2

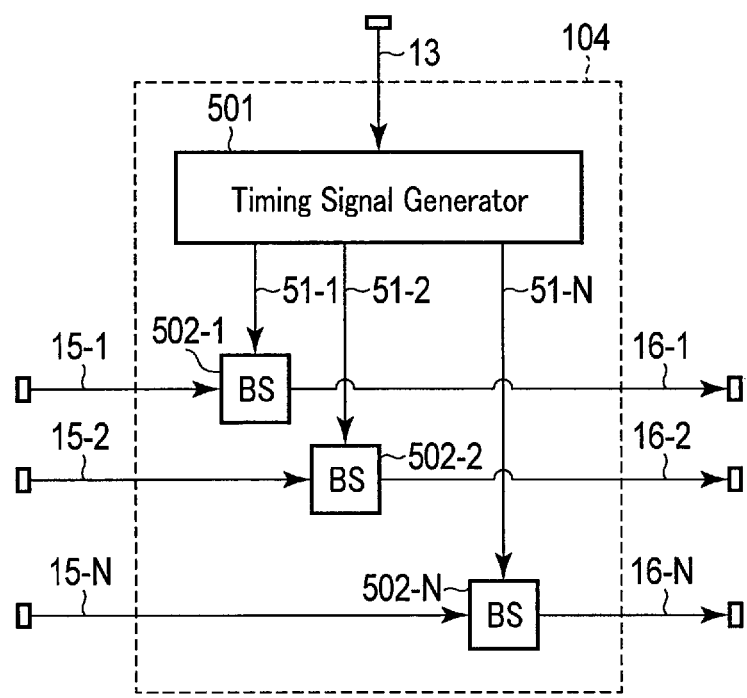
F I G. 5

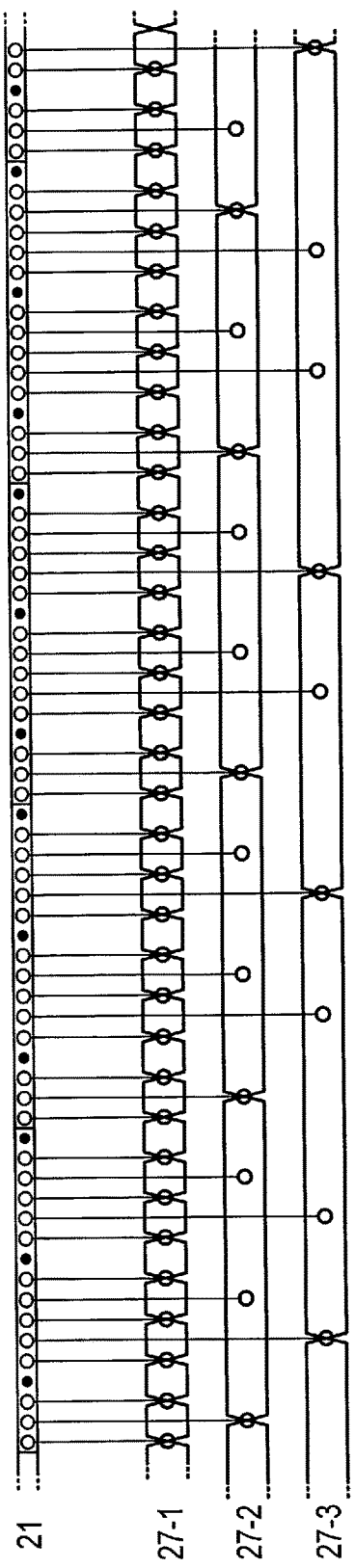
F I G. 12

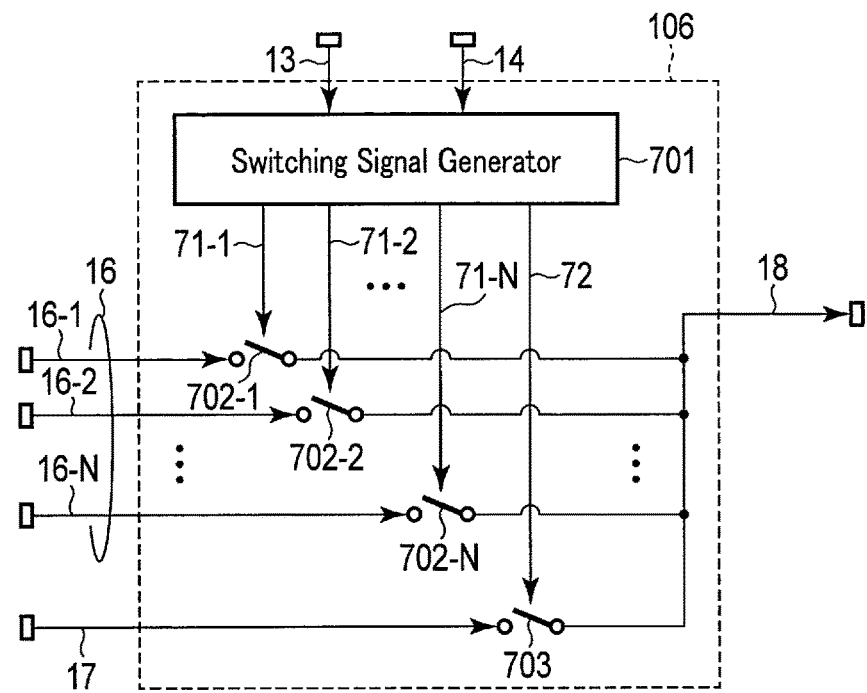
F I G. 13
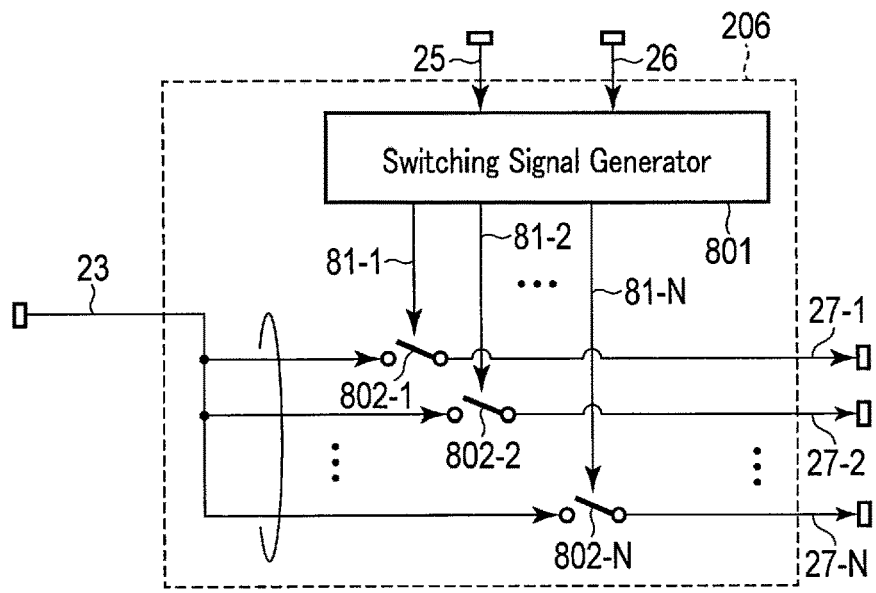
F I G. 14

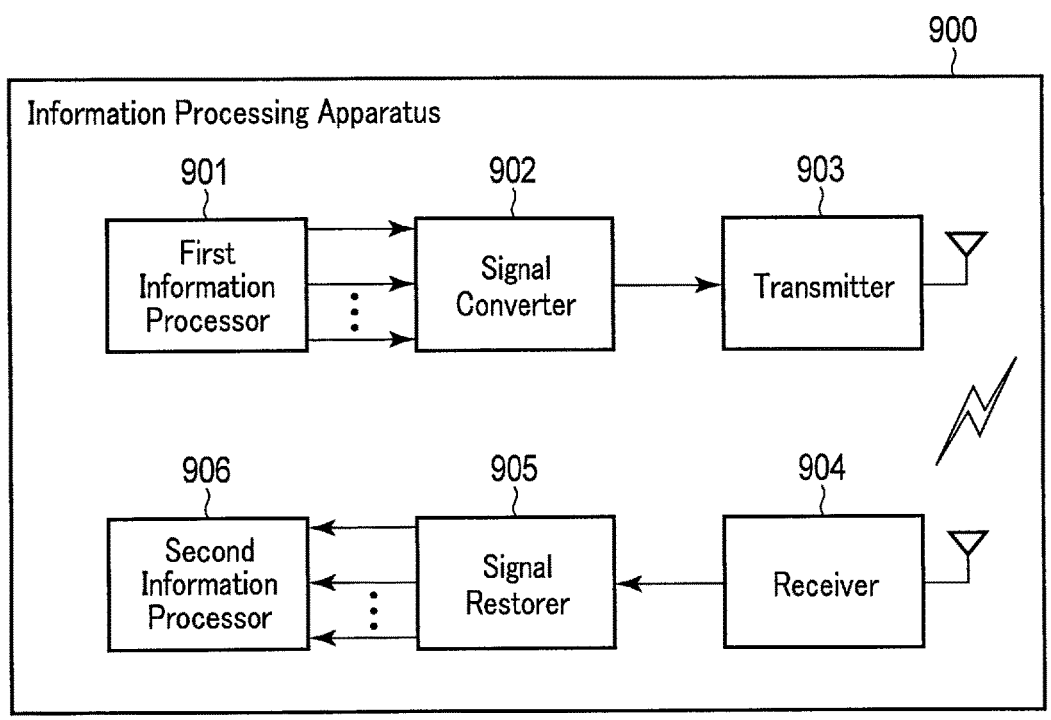
F I G. 15

SIGNAL CONVERSION APPARATUS, SIGNAL RESTORATION APPARATUS AND INFORMATION PROCESSING APPARATUS

CROSS-REFERENCE TO RELATED APPLICATIONS

This application is based upon and claims the benefit of priority from Japanese Patent Application No. 2014-110395, filed May 28, 2014, the entire contents of which are incorporated herein by reference.

FIELD

The embodiments disclosed herein relate to multiplexing and demultiplexing of signals.

BACKGROUND

Signals are simultaneously exchanged between different sections in a device, or between different devices. These signals can be transmitted in parallel if a separate transmission line is provided for each signal between the transmitter side and the receiver side. However, such an approach requires a dedicated transmission line when a simultaneously-exchanged signal is added. In other words, a new transmission line needs to be provided; as a result, occupied space and costs will increase.

To avoid this problem, it is effective to multiplex multiple signals into a single high-speed signal (called a serial signal). For example, parallel/serial conversion and an apparatus called a serializer have been conventionally used to multiplex a plurality of signals. The number of transmission lines necessary to transmit a serial signal is just one, regardless of the total number of simultaneously-exchanged signals.

Normal parallel/serial conversion deals with multiple signals having the same transmission rate. These multiple signals are multiplexed using a common sampling frequency. Such normal parallel/serial conversion is not suitable for multiplexing a plurality of signals having different transmission rates. Normally, a high sampling frequency is required for transmitting high-rate signals correctly (so that they can be restored on the receiver side). Thus, a common sampling frequency is determined based on the highest transmission rate among transmission rates of a plurality of signals. In other words, such normal parallel/serial conversion is not effective because a part of the plurality of signals is redundantly oversampled. Furthermore, a frequency of a serial signal needs to be higher in proportion to the total number of signals that are handled. For this reason, the total number of signals that can be multiplexed is easily restricted if an upper limit is set for a frequency of a serial signal.

Or, a technique of buffering a plurality of data having different priorities in a memory and multiplexing the plurality of data in the order dependent on the order of priority is known. However, with the technique, buffering the data in the memory causes a delay in the data. Furthermore, the amount of delay in each of the plurality of data is indefinite as the delay is dependent on the priorities of other data in the plurality of data.

BRIEF DESCRIPTION OF THE DRAWINGS

FIG. 1 is a block diagram illustrating a signal conversion apparatus according to the first embodiment.

FIG. 2 is a block diagram illustrating a signal restoration apparatus according to the second embodiment.

FIG. 5 is a block diagram illustrating a sampler.

FIG. 12 is a drawing illustrating the relationship between a serial signal and a restored signal group at the signal restoration apparatus in FIG. 2.

FIG. 13 is a block diagram illustrating a selector shown in FIG. 1.

FIG. 14 is a block diagram illustrating a divider shown in FIG. 2.

FIG. 15 is a block diagram illustrating an information processing apparatus according to the fifth embodiment.

DETAILED DESCRIPTION

Figure 3:
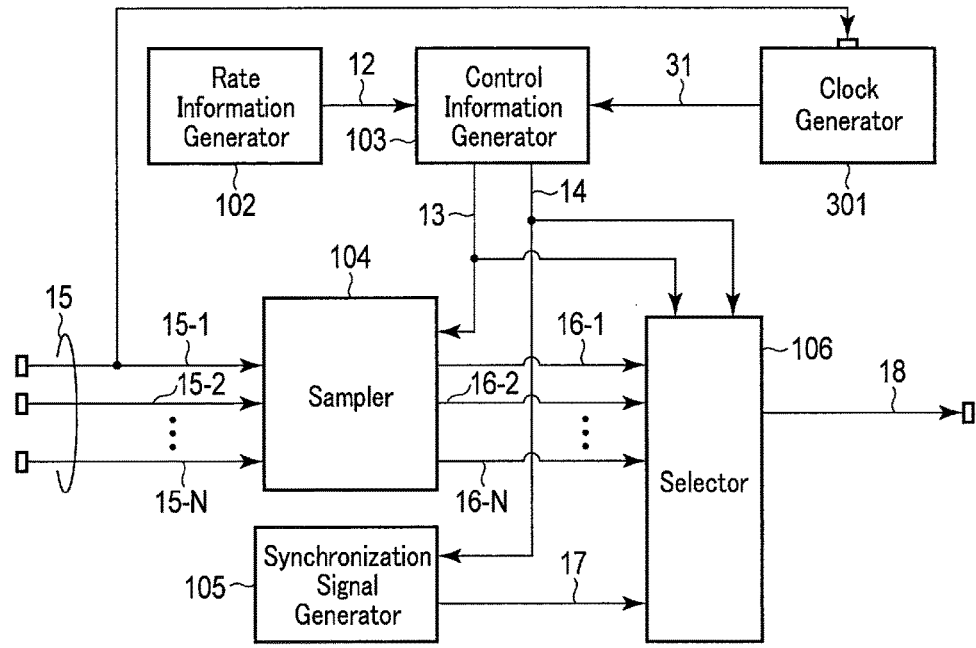
FIG. 3 is a block diagram illustrating a signal conversion apparatus according to the third embodiment.

Hereinafter, embodiments will be described with reference to the drawings.

According to an embodiment, a signal conversion apparatus includes a control information generator, a sampler, a synchronization signal generator and a selector. The control information generator generates first control information and second control information based on a clock signal and rate information indicating transmission rates of a plurality of original signals included in an original signal group. The first control information designates a first timing at which each of the plurality of original signals is sampled. The second control information designates a second timing at which a synchronization signal is output. The sampler samples each of the plurality of original signals at the first timing to obtain sampled signals. The synchronization signal generator generates the synchronization signal and outputs the synchronization signal at the second timing. The selector selects each of the sampled signals at a timing based on the first timing and selects the synchronization signal at a timing based on the second timing to obtain a serial signal. The original signal group includes a first original signal at a first transmission rate and a second original signal at a second transmission rate. The first transmission rate is higher than the second transmission rate. The frequency of allocating the first timing to the first original signal is higher than a frequency of allocating the first timing to the second original signal.

In the drawings, the same constituent elements are denoted by the same respective reference numbers, thus redundant explanations thereof will be omitted.

First Embodiment

As shown in FIG. 1, the signal conversion apparatus according to the first embodiment comprises a clock generator 101, a rate information generator 102, a control information generator 103, a sampler 104, a synchronization signal generator 105, and a selector 106. The signal conversion apparatus shown in FIG. 1 converts an original signal group 15 comprising N original signals (15-1, 15-2, . . . , 15-N) into a serial signal 18. N is an integer equal to or greater than 2.

The serial signal 18 may be transmitted over a wired communication or a wireless communication. For example, the signal process apparatus shown in FIG. 1 can further comprise a transmitter to transmit the serial signal 18 wirelessly. The transmitter may modulate bit values to radio signals using an amplitude modulation scheme, such as on-off keying.

The clock generator 101 generates a clock signal 11. The clock generator 101 outputs the clock signal 11 to the control information generator 103. For example, the clock generator 101 can generate a clock signal 11 by performing frequency conversion on an external clock signal supplied from an external device not shown in FIG. 1, or by improving a signal quality of the external clock signal. The control information generator 103 can use the external clock signal as a clock signal 11. In this case, the clock generator 101 is unnecessary.

The clock signal 11 may be frequency-synchronized with some or all of the original signals 15-1, 15-2, . . . , 15-N. Herein, two signals in frequency-synchronization means that a frequency of one of the signals is a rational number times a frequency of the other signal. As will be described later, an original signal which is frequency-synchronized with a clock signal 11 can be sampled more effectively than an original signal which is not frequency-synchronized.

The rate information generator 102 generates rate information indicating transmission rates of the original signals 15-1, 15-2, . . . , 15-N. The rate information generator 102 outputs the rate information 12 to the control information generator 103.

The rate information 12 may be expressed as a list of transmission rates of the original signals 15-1, 15-2, . . . , 15-N, for example. For example, rate information 12, such as {original signal 15-1: 3 MHz, original signal 15-2: 2 MHz, . . . , original signal 15-N: 1 MHz}, can be used. Or, the rate information 12 may be expressed as a list of values obtained by normalizing the transmission rates of the original signals 15-1, 15-2, . . . , 15-N, using a predetermined reference value (e.g., 1 MHz). For example, rate information 12, such as {original signal 15-1: 3, original signal 15-2: 2, . . . , original signal 15N: 1}, can be used. The above-mentioned reference value may be equivalent to a frequency of the clock signal 11, or may be equivalent to a value that is a rational number times the frequency.

Or, the rate information 12 may be information equivalent to a combination of first control information 13 and second control information 14 (will be described later). However, it should be noted that a combination of a timing of sampling the original signals 15-1, 15-2, . . . , 15-N and a timing of outputting synchronization signal 17 should be preferably obtainable using a pattern (may be referred to as "symbol") which repeats in a certain cycle, in order to control information volume of the rate information 12. For example, rate information 12 such as {D1, D2, D3, D1, D2, S, D1, D2, D3, D1, S, D2, D1, D3} can be used. In this example, N=3, D1, D2, and D3 respectively represent the timing of sampling each of the original signals 15-1, 15-2, and 15-3, and S represents the timing of outputting a synchronization signal 17 for synchronizing a receiver of the serial signal 18 containing the synchronization signal 17 with the signal conversion apparatus.

The rate information 12 may be prepared in advance. In this case, the rate information generator 102 is unnecessary. For example, if the transmission rates of the original signals 15-1, 15-2, . . . , 15-N are known, it is possible to write in advance the rate information 12 in a memory provided inside or outside of the signal conversion apparatus shown in FIG. 1. Or, the rate information 12 may be notified or set from outside of the signal conversion apparatus shown in FIG. 1 (e.g., a signal restoration apparatus not shown in FIG. 1). In also this case, the rate information generator 102 is unnecessary.

The control information generator 103 inputs the clock signal 11 from the clock generator 101, and inputs the rate information 12 from the rate information generator 102.

The control information generator 103 determines the timing of sampling each of the original signals 15-1, 15-2, . . . , 15-N based on the clock signal 11 and the rate information 12. The control information generator 103 generates first control information 13 that designates such timing. The control information generator 103 outputs the first control information 13 to the sampler 104 and the selector 106.

Specifically, the control information generator 103 determines the timing so that a high-speed original signal can be sampled more frequently than sampling of a low-speed original signal. Usually, a high sampling frequency is required for transmitting high-speed signals correctly. In other words, a low sampling frequency suffices the need of transmitting low-speed signals correctly. The control information generator 103 prevents a decline in sampling efficiency by allocating a different sampling frequency suitable for each of the transmission rates of the original signals 15-1, 15-2, . . . , 15-N, not the same sampling frequency. Accordingly, unless all of the transmission rates of the original signals 15-1, 15-2, . . . , 15-N are the same, the timing allocated to each of the original signals 15-1, 15-2, . . . , 15-N will not be completely the same. On the other hand, if two or more of the original signals 15-1, 15-2, . . . , 15-N are mutually synchronized (in other words, the timing of when a signal value is changed correspond), the control information generator 103 may allocate the same timing for the synchronized signals.

Furthermore, the control information generator 103 determines timing of outputting a synchronization signal 17 from the synchronization signal generator 105 based on the clock signal 11 and the rate information 12. The control information generator 103 generates second control information 14 that designates such timing. The control information generator 103 outputs the second control information 14 to the synchronization signal generator 105 and the selector 106.

The sampler 104 receives the original signal group 15, and inputs the first control information 13 from the control information generator 103. The sampler 104 samples each of the original signals 15-1, 15-2, . . . , 15-N at the timing designated by the first control information 13 to obtain a sampled signal group 16 comprising N sampled signals 16-1, 16-2, . . . , 16-N. The sample 104 outputs the sampled signal group 16 to the selector 106.

A specific example of the sampler 104 is shown in FIG. 5. The sampler 104 shown in FIG. 5 comprises a timing signal generator 501 and N bit samplers 502-1, 502-1, . . . , 502-N.

The timing signal generator 501 generates timing signals 51-1, 51-2, . . . , 51-N for the bit samplers 502-1, 502-1, . . . , 502-N based on the first control information 13. For example, suppose each of timing $t_{11}, t_{21}, \ldots, t_{N1}$ for sampling each of the original signals 15-1, 15-2, . . . , 15-N is designated by the first control information 13. The timing signal generator 501 may generate pulse signals that rise at timing $t_{11}, t_{21}, \ldots, t_{N1}$ as the timing signals 51-1, 51-2, . . . , 51-N, or may generate pulse signals that fall at timing $t_{11}, t_{21}, \ldots, t_{N1}$ as the timing signals 51-1, 51-2, . . . , 51-N. The timing signal generator 501 outputs timing signals 51-1, 51-1, . . . , 51-N to the bit samplers 502-1, 502-2, . . . , 502-N, respectively.

The bit samplers 502-1, 502-2, . . . , 502-N respectively receive the original signals 15-1, 15-2, . . . , 15-N, and receive timing signals 51-1, 51-2, . . . , 51-N from the timing signal generator 501. The bit samplers 502-1, 502-2, . . . , 502-N respectively obtain the sampled signals 16-1, 16-2, . . . , 16-N by sampling the timing signals 15-1, 15-2, . . . , 15-N in accordance with timing signals 51-1, 51-1, . . . , 51-N. Specifically, the bit samplers 502-1, 502-2, . . . , 502-N may sample the original signals 15-1, 15-2, . . . , 15-N, using the rising edges or falling edges of the timing signals 51-1, 51-2, . . . , 51-N as triggers. The levels of the sampled signals 16-1, 16-2, . . . , 16-N may be "1" if the levels at the time of sampling the original signals 15-1, 15-2, . . . , 15-N are higher than a threshold, and if not, the levels may be "0".

Or, the bit samplers 502-1, 502-2, . . . , 502-N may sample the original signals 15-1, 15-2, . . . , 15-N on a regular basis, using the clock signal 11. In this case, the bit samplers 502-1, 502-2, . . . , 502-N may output sample values as sampled signals 16-1, 16-2, . . . , 16-N upon detecting the rising edges or falling edges of the timing signals 51-1, 51-2, . . . , 51-N.

In general, it is easier to maintain high transmission quality of a serial signal when the probabilities of occurrence of "1" and that of "0" are balanced than when the probabilities are not balanced. However, if the levels of most of the original signals 15-1, 15-2, . . . , 15-N are low, the probability of occurrence of "0" in the serial signal 18 becomes extremely high compared to the probability of occurrence of "1".

Thus, the sampler 104 may output a logical inversion bit value instead of a bit value obtained by sampling of a part of the original signals 15-1, 15-2, . . . , 15-N, for example. Specifically, a part of the bit samplers 502-1, 502-2, . . . , 502-N may be modified so as to output the logical inversion bit value. As another modification, approximately a half of the original signals 15-1, 15-2, . . . , 15-N may be randomly selected as the original signals to be logically inverted. Or, the original signals 15-1, 15-2, . . . 15-N with less changes in their signal values may be randomly selected, up to approximately a half of the original signals, as the original signals to be logically inverted.

As another modification, the sampler 104 may be modified to change which of the bit values obtained by the sampling or the logical inversion bit values obtained by sampling are to be output for every sample. For example, if a combination of the timing of sampling the original signals 15-1, 15-2, . . . , 15-N and the timing of outputting synchronization signals 17 is obtainable using a set of symbols that repeat in a certain cycle, some sort of inversion/non-inversion pattern may be allocated for a first symbol, and a reverse of the inversion/non-inversion pattern that is allocated to the immediately preceding symbol may be allocated for the second symbol or thereafter.

According to such modifications, even if the levels of most of the original signals 15-1, 15-2, . . . , 15-N are low, the probability of occurrence of "0" and the probability of occurrence of "1" in the serial signal 18 will be easily balanced. The signal restoration apparatus not shown in FIG. 1 can obtain appropriate restored signals by specifying the above logical inversion bit value and then performing logical inversion once again.

The synchronization signal generator 105 inputs the second control information 14 from the control information generator 103. The rate information generator 105 generates synchronization signals 17, and outputs the synchronization signals 17 to the selector 106 at a timing designated by the second control information 14.

As mentioned above, it is easier to maintain high transmission quality of a serial signal when the probability occurrence of "1" and that of "0" are balanced than when the probabilities are not balanced. Thus, for example, if a combination of the timing of sampling the original signals 15-1, 15-2, . . . , 15-N and the timing of outputting synchronization signals 17 is obtainable using a symbol that repeats in a certain cycle, the synchronization signal generator 105 may switch between output of a logically-inverted generated synchronization signal 17 and output of a non-inverted generated synchronization signal 17 for each symbol.

Furthermore, the synchronization signal generator 105 may determine whether to output a logically-inverted generated synchronization signal 17 or to output a non-inverted generated synchronization signal 17 based on the probability of occurrence of "1" and that of "0" in the past serial signal 18. For example, if the probability of occurrence of "1" in the past serial signal 18 is higher than that of "0", the synchronization signal generator 105 may determine inversion or non-inversion of a generated synchronization signal 17 for each symbol in a manner such that the probability of occurrence of output of "0" as a synchronization signal 17 becomes higher. Or, if the probability of occurrence of "1" in the past serial signal 18 is lower than that of "0", the synchronization signal generator 105 may determine inversion or non-inversion of a generated synchronization signal 17 for each symbol in a manner such that the probability of occurrence of output of "1" as a synchronization signal 17 becomes higher.

The selector 106 inputs the first control information 13 and the second control information 14 from the control information generator 103, inputs the sampled signal group 16 from the sampler 104, and inputs the synchronization signal 17 from the synchronization signal generator 105. The selector 106 obtains the serial signal 18 by selecting any one of the sampled signals 16-1, 16-2, . . . , 16-N and the synchronization signal 17 at a certain cycle.

Specifically, the selector 106 selects any one of the sampled signals 16-1, 16-2, . . . , 16-N at a timing based on the timing designated by the first control information 13. For example, suppose each of timing $t_{11}, t_{21}, \ldots, t_{N1}$ for sampling each of the original signals 15-1, 15-2, . . . , 15-N is designated by the first control information 13. The selector 106 selects the sampled signals 16-1, 16-2, . . . , 16-N at timing $t_{11}+d_{11}, t_{21}+d_{21}, \ldots, t_{N1}+d_{N1}$ respectively. Delay amounts $d_{11}, d_{21}, \ldots, d_{N1}$ are M times (M is a natural number) a cycle of the clock signal 11, for example. It should be noted that the delay amounts $d_{11}, d_{21}, \ldots, d_{N1}$ are typically the same, but they can be different. As will be described later, it is necessary to differentiate the timing for selecting each of a plurality of sample signals from each other even if the sampling timing for a plurality of original signals corresponding to the sample signals is the same; thus, the delay amounts accompanying the plurality of sample signals are not always the same.

On the other hand, the selector 106 selects the synchronization signal 17 at a timing based on the timing designated by the second control information 14. For example, suppose timing $t_{S1}$ for outputting the synchronization signal 17 is designated by the second control information 14. The selector 106 may select the synchronization signal 17 at timing $t_{S1}+d_{S1}$. The delay amount $d_{S1}$ is M times a cycle of the clock signal 11, for example.

It is possible to convert the original signal group 15 into a serial signal 18 with a small delay by minimizing the delay amounts $d_{11}, d_{21}, \ldots, d_{N1}$ (for example, minimizing the delay amounts in a manner such that they become equal to one cycle of the clock signal 11). Thus, the signal conversion apparatus shown in FIG. 1 can handle original signals having small permitted delay amounts.

FIG. 13 shows a specific example of the selector 106. The selector 106 shown in FIG. 13 comprises a switching signal generator 701 and (N+1) switches 702-1, 702-2, ..., 702-N, 703. It should be noted that no more than two switches of the switches 702-1, 702-2, ..., 702-N, 703 are turned ON at the same time.

The switching signal generator 701 generates switching signals 71-1, 71-2, ..., 71-N, 72 for the (N+1) switches 702-1, 702-2, ..., 702-N, 703 based on the first control information 13 and the second control information 14. For example, suppose each of timing $t_{11}, t_{21}, \ldots, t_{N1}$ for sampling each of the original signals 15-1, 15-2, ..., 15-N is designated by the first control information 13, and timing $t_{S1}$ for outputting the synchronization signal 17 is designated by the second control information 14. The timing signal generator 701 may generate pulse signals that rise at timing $t_{21}+d_{21}, \ldots, t_{N1}+d_{N1}, t_{S1}+d_{S1}$ as the switching signals 71-1, 71-2, ..., 71-N, 72, or may generate pulse signals that fall at timing $t_{11}+d_{11}, t_{21}+d_{21}, \ldots, t_{N1}+d_{N1}, t_{S1}+d_{S1}$ as the switching signals 71-1, 71-2, ..., 71-N, 72. The switching signal generator 701 outputs the switching signal 71-1, 71-2, ..., 71-N, 72 to switches 702-1, 702-2, ..., 702-N, 703, respectively.

The switches 702-1, 702-2, ..., 702-N respectively input the sampled signals 16-1, 16-2, ..., 16-N, and respectively input switching signals 71-1, 71-2, ..., 71-N from the switching signal generator 701. The switches 702-1, 702-2, ..., 702-N may be in an ON state when the level of the switching signal 72 is "1" or "0". While each of the switches 702-1, 702-2, ..., 702-N is in an ON state, each of the sampled signals 16-1, 16-2, ..., 16-N is selected as the serial signal 18.

The switch 703 inputs the synchronization signal 17 from the synchronization signal generator 105, and inputs the switching signal 72 from the switching signal generator 701. The switch 703 may be in an ON state when the level of the switching signal 72 is "1" or "0". While the switch 703 is in an ON state, the synchronization signal 17 is selected as the serial signal 18.

Figure 6:
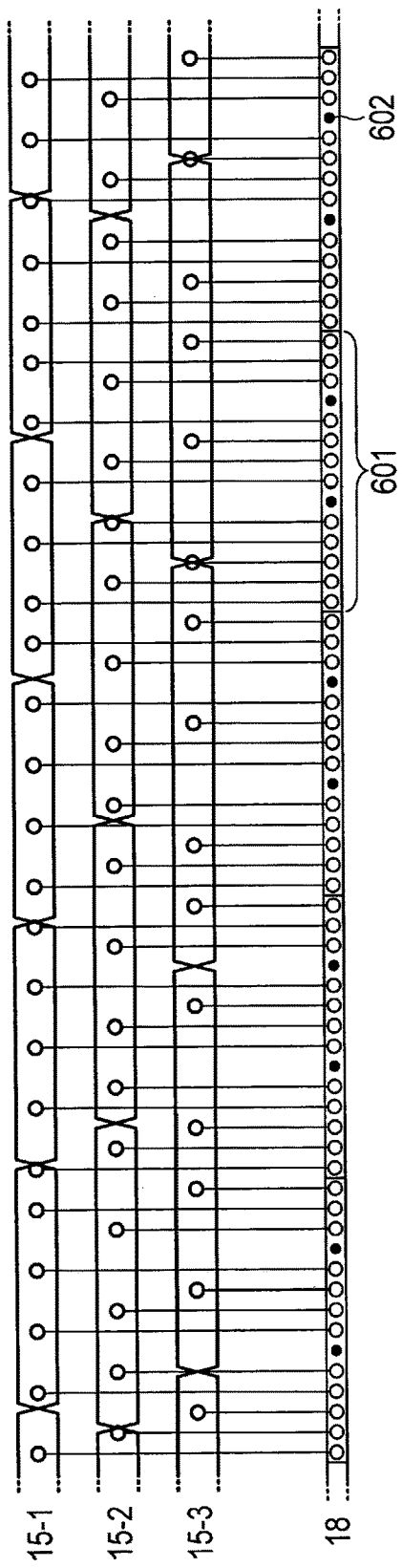
FIG. 6 is a drawing illustrating the relationship between an original signal group and a serial signal at the signal conversion apparatus in FIG. 1.

The signal conversion apparatus shown in FIG. 1 can convert three original signals 15-1, 15-2, and 15-3 into a serial signal 18, as shown in FIG. 6. In FIG. 6, the white points included in each of the original signals 15-1, 15-2, and 15-3 represent signal values of each of the original signals 15-1, 15-2, and 15-3 at the above-mentioned timing $t_{11}, t_{21},$ and $t_{31}$. In other words, the groups of white points included in the original signals 15-1, 15-2, and 15-3 correspond to the sampled signals 16-1, 16-2, and 16-3 respectively. In the example shown in FIG. 6, the rate of the original signal 15-1 is the highest, and the rate of the original signal 15-3 is the lowest. Accordingly, the control information generator 103 generates the first control information 13 such that sampling the original 15-1 is perform the most frequently and sampling the original signal 15-3 is performed the least frequently.

Furthermore, the white points and black points included in the serial signal 18 represent signal values of the serial signal 18. Specifically, of the white points included in the serial signal 18, the ones connected by lines to the white points included in the original signal 15-1 with the lines correspond to the original signal 15-1 which is sampled at timing $t_{11}$, and they represent a signal value of the serial signal 18 at timing $t_{11}+d_{11}$. Similarly, of the white points included in the serial signal 18, the ones connected by lines to the white points included in the original signal 15-2 (or 15-3) correspond to the original signal 15-2 (or 15-3) which is sampled at timing $t_{21}$ (or $t_{31}$), and they represent a signal value of the serial signal 18 at timing $t_{21}+d_{21}$ (or $t_{31}+d_{31}$). A black point 602 included in the serial signal 18 corresponds to a synchronization signal 17 that is output at timing $t_{S1}$, and represents a signal value of the serial signal 18 at timing $t_{S1}+d_{S1}$.

It should be noted that a combination of the timing of sampling the original signals 15-1, 15-2, ..., 15-N and the timing of outputting the synchronization signal 17 may be obtainable using a symbol which repeats in a certain cycle. For example, in FIG. 6, the above combination corresponds to a symbol 601 that repeats every 14 samples. Accordingly, in this case, once the control information generator 103 determines the timing for all 14 samples, it is possible to uniquely specify all timings. As a result, it is possible to reduce the information volume of the first control information 13 and that of the second control information 14, and the calculation amount required at the control information generator 103, compared to the case where the control information generator 103 determines the timing for all samples, one by one.

Figure 9:
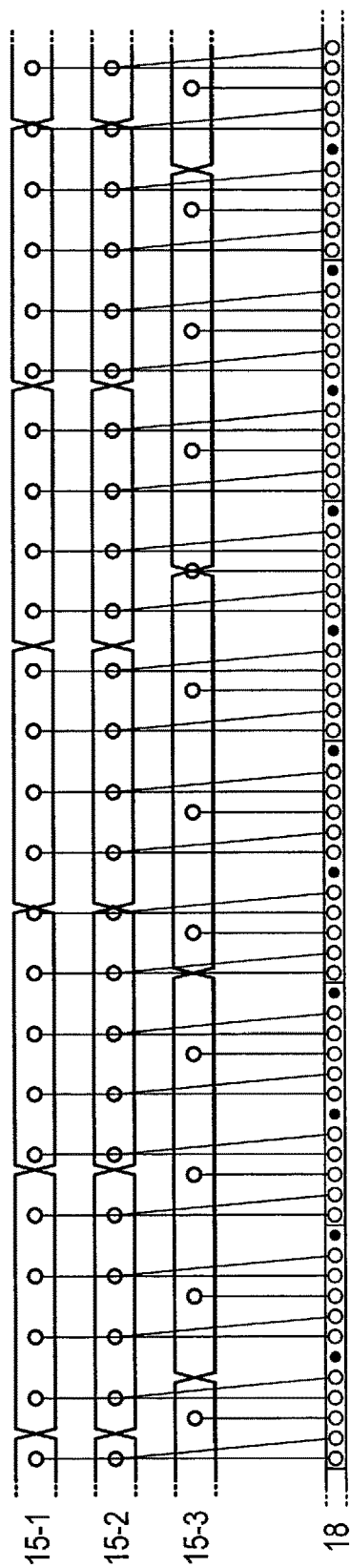
FIG. 9 is a drawing illustrating the relationship between an original signal group and a serial signal at the signal conversion apparatus in FIG. 1.

As mentioned above, if two or more original signals of the original signals 15-1, 15-2, ..., 15-N are synchronized to each other, the control information generator 103 may allocate the same timing to the synchronized signals. For example, the signal conversion apparatus shown in FIG. 1 converts three original signals 15-1, 15-2, and 15-3 into a serial signal 18, as shown in FIG. 9. Herein, the original signals 15-1 and 15-2 are synchronized to each other. The meanings of the white and black points shown in FIG. 9 are the same as those in FIG. 6. Thus, the synchronization between the original signal 15-1 and the original signal 15-2 can be maintained in the restored signal group by sampling the original signals 15-1 and 15-2 at the same timing and converting the serial signal appropriately by the signal restoration apparatus (not shown in FIG. 1). Furthermore, a clock skew can be prevented if a restored signal corresponding to either one of the original signals 15-1 and 15-2 is used as a clock signal for sampling a restored signal corresponding to the other.

Figure 11:
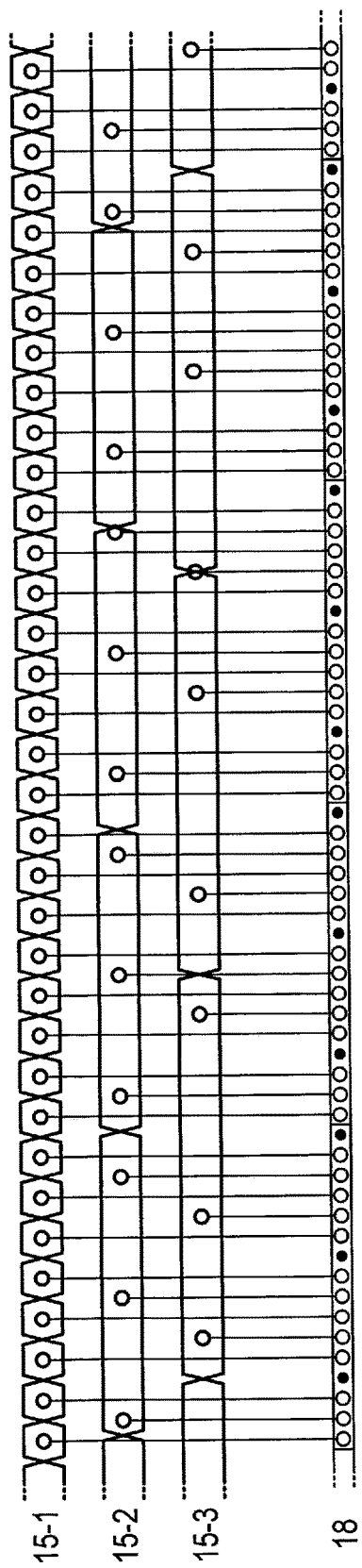
FIG. 11 is a drawing illustrating the relationship between an original signal group and a serial signal at the signal conversion apparatus in FIG. 1.

As described above, an original signal which is frequency-synchronized with a clock signal 11 can be sampled more effectively than an original signal which is not frequency-synchronized. For example, the signal conversion apparatus shown in FIG. 1 converts three original signals 15-1, 15-2, and 15-3 into a serial signal 18, as shown in FIG. 11. In the example of FIG. 11, although the frequency of the original signal 15-1 is half of the frequency of the clock signal 11, the original signals 15-2 and 15-3 are not frequency-synchronized with the clock signal 11. The meanings of the white and black points shown in FIG. 11 are the same in those in FIG. 6. It is possible to minimize the number of times of sampling required for transmitting the original signal 15-1 correctly (i.e., one transmission per cycle) by synchronizing the timing $t_{11}$ with the clock signal 11.

As explained above, the signal conversion apparatus according to the first embodiment allocates timing such that each of a plurality of original signals is sampled at the frequency suitable for the transmission rate of the original signal. Thus, the signal conversion apparatus can reduce degradation of sampling efficiency. Furthermore, the signal conversion apparatus serializes a plurality of sampled signals at a timing based on the above timing. Therefore, according to the signal conversion apparatus, a plurality of original signals having different transmission rates can be multiplexed with a small delay.

Second Embodiment

As shown in FIG. 2, the signal restoration apparatus according to the second embodiment comprises a clock generator 201, a sampler 202, a control information generator 203, a rate information generator 204, a synchronization signal generator 205, and a divider 206. The signal restoration apparatus shown in FIG. 2 restores a serial signal 21 (corresponding to the serial signal 18 shown in FIG. 1, for example) to a restored signal group including N restored signals 27-1, 27-2, ..., 27-N.

The serial signal 21 may be transmitted over a wired communication or a wireless communication. For example, the signal restoration apparatus shown in FIG. 2 can further comprise a receiver to receive the serial signal 21 wirelessly. The receiver may demodulate a bit value from a radio signal using a demodulation scheme corresponding to an amplitude modulation scheme, such as on-off keying.

The clock generator 201 receives the serial signal 21, and generates a clock signal 22 which is synchronized with the serial signal 21. The clock generator 201 outputs the clock signal 22 to the sampler 202 and the control information generator 203.

The sampler 202 receives the serial signal 21, and inputs the clock signal 22 from the clock generator 201. The sampler 202 samples the serial signal 21 in synchronization with the clock signal 22 to obtain a sampled serial signal 23. The sampler 202 outputs the sampled serial signal 23 to the synchronization signal detector 205 and the divider 206.

The rate information generator 204 generates rate information 28 indicating the transmission rates of the restored signals 27-1, 27-2, ..., 27-N. The rate information generator 204 outputs the rate information 28 to the control information generator 203. The rate information 28 may be the same as or similar to the aforementioned rate information 12.

The rate information 28 may be prepared in advance. In this case, the rate information generator 204 is unnecessary. For example, if the transmission rates of the restored signals 27-1, 27-2, ..., 27-N are known, it is possible to write the rate information 28 in a memory provided inside or outside of the signal restoration apparatus shown in FIG. 2 in advance. Or, the rate information 28 may be notified or set from outside of the signal restoration apparatus shown in FIG. 2 (e.g., a signal conversion apparatus not shown in FIG. 2). In this case as well, the rate information generator 204 is unnecessary.

The control information generator 203 inputs the clock signal 22 from the clock generator 201, and inputs the rate information 28 from the rate information generator 204. The control information generator 203 can operate on an algorithm the same as or similar to the algorithm of a control information generator included in a signal conversion apparatus (not shown) that generates the serial signal 21 (e.g., the control information generator 103).

The control information generator 203 estimates, based on the clock signal 22 and the rate information 28, relative timing when each sample included in the sampled serial signal 23 should be output as one of the restored signals 27-1, 27-2, ..., 27-N included in the restored signal group 27. For example, the control information generator 203 estimates relative timing so that a high-speed restored signal can be output more frequently than the output of a low-speed restored signal. This relative timing can be expressed in a form of the number of differential clocks with respect to reference timing specified by, for example, the clock signal 22 and the position of a synchronization signal in the sampled serial signal 23 (will be described later in detail). The control information generator 203 generates fourth control information 25 that designates such timing. The control information generator 203 outputs the fourth control information 25 to the divider 206.

Furthermore, the control information generator 203 estimates relative timing when a synchronization signal should emerge in the sampled serial signal 23 based on the clock signal 22 and the rate information 28. This relative timing can be expressed in a form of the number of differential clocks with respect to the above-mentioned reference timing, for example. The control information generator 203 generates third control information 24 that designates such timing. The control information generator 203 outputs the third control information 24 to the synchronization signal detector 205.

The synchronization signal detector 205 inputs the sampled serial signal 23 from the sampler 202, and inputs the third control information 24 from the control information generator 203. The synchronization signal detector 205 detects the position of the synchronization signal included in the sampled serial signal 23 based on the relative timing indicated by the third control information 24. The synchronization signal detector 205 generates fifth control information 26 indicating timing of the first sample of the sampled serial signal 23 based on the detected position of the synchronization signal. The synchronization signal detector 205 outputs the fifth control information 26 to the divider 206.

Specifically, the synchronization signal detector 205 cannot obtain an absolute position of the synchronization signal from the third control information 24. In other words, the synchronization signal detector 205 cannot immediately specify from the third control information 24 as to which sample included in the sampled serial signal 23 the given synchronization signal corresponds. However, the synchronization signal detector 205 can obtain a relative position of the synchronization signal (e.g., after how many samples of a synchronization signal, a different synchronization signal will emerge). In other words, if an absolute position of at least one synchronization signal is detected, the synchronization signal detector 205 can specify absolute positions of other synchronization signals based on the third control information 24.

For example, the synchronization signal detector 205 generates S provisional synchronization signals, and performs a pattern match on samples included in the sampled serial signal 23, using the S provisional synchronization signals. S is a natural number equal to or greater than 2. The greater S becomes, the more the probability of erroneous detection of a synchronization signal can be reduced; however, the delay until when the fifth control information 26 is generated will become greater. The synchronization signal detector 205 may generate the provisional synchronization signals on an algorithm the same as or similar to the algorithm of a synchronization signal generator included in a signal conversion apparatus (not shown in FIG. 2) that generates the serial signal 21 (e.g., the synchronization signal generator 105).

Figure 8:
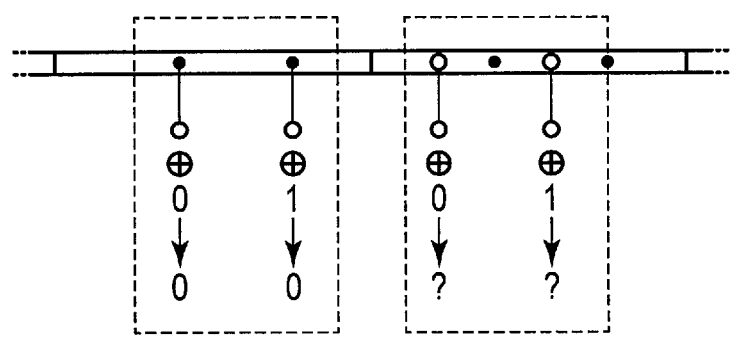
FIG. 8 is an explanatory drawing of the operation of the synchronization detector shown in FIG. 2.

As shown in FIG. 8, for example, the synchronization signal detector 205 generates two provisional synchronization signals {0, 1} corresponding to two synchronization signals. These synchronization signals are targets for detection. The synchronization signal detector 205 performs pattern matching on samples included in the sampled serial signal 23, using those provisional synchronization signals. If both of the two samples to be compared are equivalent to the synchronization signals, the exclusive logical sums of each of the generated provisional synchronization signals {0, 1} and each of those two samples will be "0". Conversely, at least one of the exclusive logical sums of each of the generated provisional synchronization signals {0, 1} and each of the two samples to be compared is "1", the two samples are not equivalent to synchronization signals.

However, as described above, there is a possibility that the synchronization signals included in the sampled serial signal 23 have been logically-inverted after being generated at the signal conversion apparatus not shown in FIG. 2. For this reason, if it is known to the synchronization signal detector 205 that synchronization signals that are a target for detection is logically-inverted, provisional synchronization signals can also be logically-inverted. On the other hand, if it is unknown to the synchronization signal detector 205 whether synchronization signals that are a target for detection are logically-inverted or not, the synchronization signal detector 205 can operate on the assumption of both of the case where the synchronization signals are logically-inverted and the case where the synchronization signals are not logically-inverted. For example, the synchronization signal detector 205 can take not only "0"s of the exclusive logical sums, but also "1"s as detection of synchronization signals.

The divider 206 inputs the sampled serial signal 23 from the sampler 202, inputs the fourth control information 25 from the control information generator 203, and inputs the fifth control information 26 from the synchronization signal detector 205. The divider 206 obtains the restored signal group 27 by outputting each of the samples included in the sampled serial signal 23 (except for the samples equivalent to the synchronization signals) as any one of the restored signals 27-1, 27-2, . . . , 27-N.

Specifically, the divider 206 specifies the timing of outputting each sample included in the sampled serial signal 23 as any one of the restored signals 27-1, 27-2, . . . , 27-N based on the fourth control information 25 and the fifth control information 26. The divider 206 then outputs each sample included in the sampled serial signal 23 as any one of the restored signals 27-1, 27-2, . . . , 27-N in accordance with the specified timing.

FIG. 14 shows a specific example of the divider 206. The divider 206 shown in FIG. 14 comprises a switching signal generator 801 and N switches 802-1, 802-2, . . . , 802-N.

The switching signal generator 801 generates switching signals 81-1, 81-2, . . . , 81-N for N switches 802-1, 802-2, . . . , 802-N based on the fourth control information 25 and the fifth control information 26. For example, suppose timing $t_{12}, t_{22}, \ldots, t_{N2}$ for outputting each sample included in the sampled serial signal 23 as any one of the restored signals 27-1, 27-2, . . . , 27-N is specified. The switching signal generator 801 may generate pulse signals that rise at timing $t_{12}, t_{22}, \ldots, t_{N2}$ as the switching signals 81-1, 81-2, . . . , 81-N, or may generate pulse signals that fall at timing $t_{12}, t_{22}, \ldots, t_{N1}$ as the switching signals 81-1, 81-2, . . . , 81-N. The switching signal generator 801 outputs the switching signals 81-1, 81-2, . . . , 81-N to the switches 802-1, 802-2, . . . , 802-N, respectively.

The switches 802-1, 802-2, . . . , 802-N input the same sampled serial signal 23 from the sampler 202, and input switching signals 81-1, 81-2, . . . , 81-N from the switching signal generator 801 respectively. The switches 802-1, 802-2, . . . , 802-N may be in an ON state when the levels of the switching signals 81-1, 81-2, . . . , 81-N are "1" or "0". While the switches 802-1, 802-2, . . . , 802-N are in an ON state, the sampled serial signals 23 are respectively selected as the restored signals 27-1, 27-2, . . . , 27-N. Since the samples equivalent to the synchronization signals are not selected by any of the switches 802-1, 802-2, . . . , 802-N, the samples would not be mixed into the restored signal group 27.

It should be noted that a plurality of samples can be in synchronization when being output. In this case, however, a plurality of samples that are synchronously output are subsequently input to the divider 206 at different timing. The divider 206 selects the plurality of samples in the order of input, using any one of the switches 802-1, 802-2, . . . , 802-N, and buffers the selected samples at the later stage of the switch. The divider 206 then outputs the buffered samples in synchronization with the selective output of a sample with the latest input timing among the plurality of samples.

Figure 7:
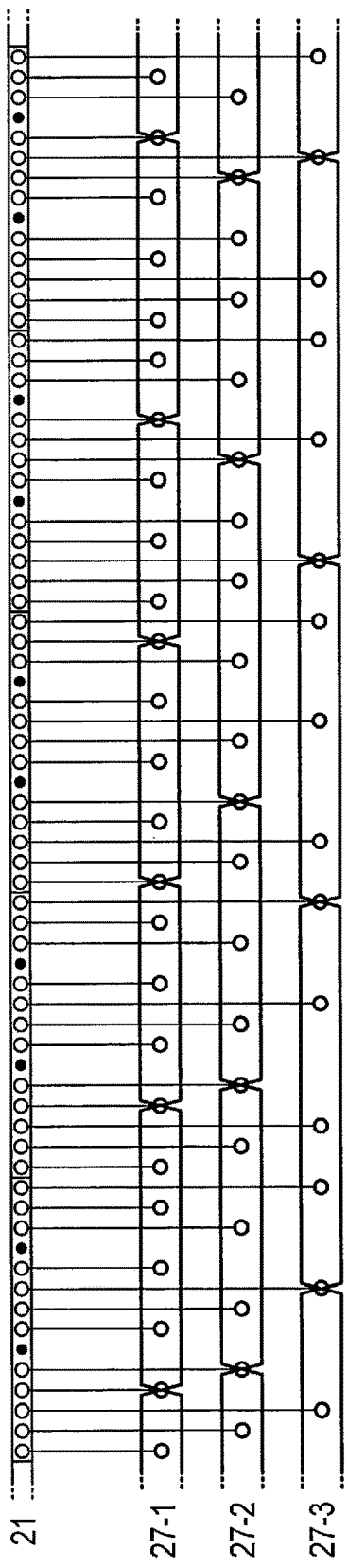
FIG. 7 is a drawing illustrating the relationship between a serial signal and a restored signal group at the signal conversion apparatus in FIG. 2.

The signal restoration apparatus shown in FIG. 2 can convert the serial signal 21 into three original signals 27-1, 27-2, and 27-3, as shown in FIG. 7. In FIG. 7, the white points included in each of the restored signals 27-1, 27-2, and 27-3 represent signal values of each of the restored signals 27-1, 27-2, and 27-3 at the above-mentioned timing $t_{12}, t_{22},$ and $t_{32}$.

Furthermore, the white points and black points included in the serial signal 21 represent signal values sampled by the sampler 202. In other words, the white point group and black point group included in the serial signal are equivalent to the sampled serial signal 23. Specifically, of the white points included in the serial signal 21, the ones connected by lines to the white points included in the restored signal 27-1 correspond to the restored signal 27-1 which is output at timing $t_{12}$, and they represent a signal value of the restored signal 27-1 at timing $t_{12}$. Similarly, of the white points included in the serial signal 21, the ones connected by lines to the white points included in the restored signal 27-2 (or 27-3) correspond to the restored signal 27-2 (or 27-3) which is output at timing $t_{22}$ (or $t_{32}$), and they represent a signal value of the restored signal 27-2 (or 27-3) at timing $t_{22}$ (or $t_{32}$). The black points included in the serial signal 21 correspond to the synchronization signals, and they are not mixed with any of the restored signal groups 27.

Figure 10:
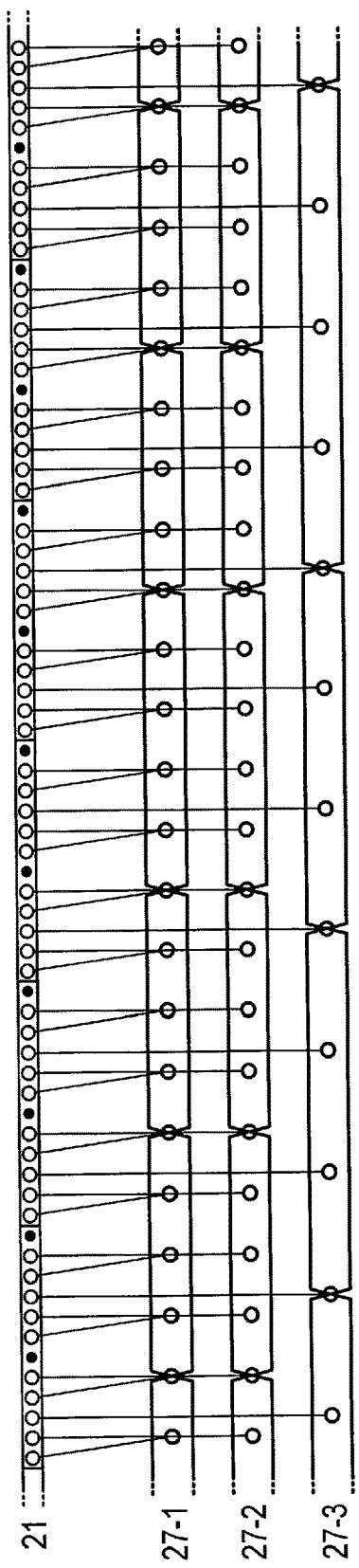
FIG. 10 is a drawing illustrating the relationship between a serial signal and a restored signal group at the signal restoration apparatus in FIG. 2.

If the serial signal 21 is generated as shown in FIG. 9, the signal restoration apparatus shown in FIG. 2 can convert the serial signal 21 into three restored signals 27-1, 27-2, and 27-3, as shown in FIG. 10. Similarly, if the serial signal 21 is generated as shown in FIG. 11, the signal restoration apparatus shown in FIG. 2 can convert the serial signal 21 into three restored signals 27-1, 27-2, and 27-3, as shown in FIG. 12.

As explained above, the signal restoration apparatus according to the second embodiment allocates timing in a manner such that each of a plurality of restored signals is output at the frequency suitable for the transmission rate of the restored signal. Therefore, according to the signal restoration apparatus, a serial signal generated by the signal conversion apparatus according to the aforementioned first embodiment, for example, can be appropriately demultiplexed.

Third Embodiment

The signal conversion apparatus shown in FIG. 1 may be modified as shown in FIG. 3. The signal conversion apparatus shown in FIG. 3 comprises a clock generator 301, a rate information generator 102, a control information generator 103, a sampler 104, a synchronization signal generator 105, and a selector 106. The rate information generator 102, the control information generator 103, the sampler 104, the synchronization signal generator 105, and the selector 106 in FIG. 3 are the same as or similar to those in FIG. 1.

The serial signal 18 may be transmitted over a wired communication or a wireless communication. For example, the signal processing apparatus shown in FIG. 3 can further comprise a transmitter to transmit the serial signal 18 wirelessly. This additional transmitter may modulate a bit value to a radio signal using an amplitude modulation scheme, such as on-off keying.

The clock generator 301 inputs an original signal 15-1. The clock generator 301 may input any of the original signals 15-2, . . . , 15-N instead of the original signal 15-1. The clock generator 301 generates a clock signal 31 based on the original signal 15-1. The clock generator 301 outputs the clock signal 31 to the control information generator 103.

Specifically, if the original signal 15-1 is a clock-like signal, the clock generator 301 may improve the signal quality of the original signal 15-1 to generate the clock signal 31, or may improve the signal quality of the original signal 15-1 and then convert the frequency of the original signal 15-1 to generate the clock signal 31, or may just convert the frequency of the original signal 15-1 to generate the clock signal 31. Or, if the original signal 15-1 is a clock-like signal, the control information generator 103 may use the original signal 15-1 as the clock signal 31. In this case, the clock generator 301 is unnecessary.

If the original signal 15-1 is a clock embedded-type signal like an 8b/10b-converted signal, the clock generator 301 may generate the clock signal 31 based on the clock information embedded in the original signal 15-1. Or, the clock generator 301 may generate a basic clock signal based on the clock information embedded in the original signal 15-1, and convert the frequency of the basic clock signal to generate the clock signal 31.

If the signal value of the original signal 15-1 randomly changes in a certain cycle, the clock generator 301 may observe the timing of when the signal value of the original signal 15-1 is changed over a certain period of time to analyze the cycle of the change, and may generate a clock signal 31 based on the cycle.

As explained above, the signal conversion apparatus according to the third embodiment generates a clock signal based in part on a plurality of original signals. Therefore, the signal conversion apparatus negates the need of clock input from the external and clock generating elements, such as a crystal oscillator, etc.

Fourth Embodiment

Figure 4:
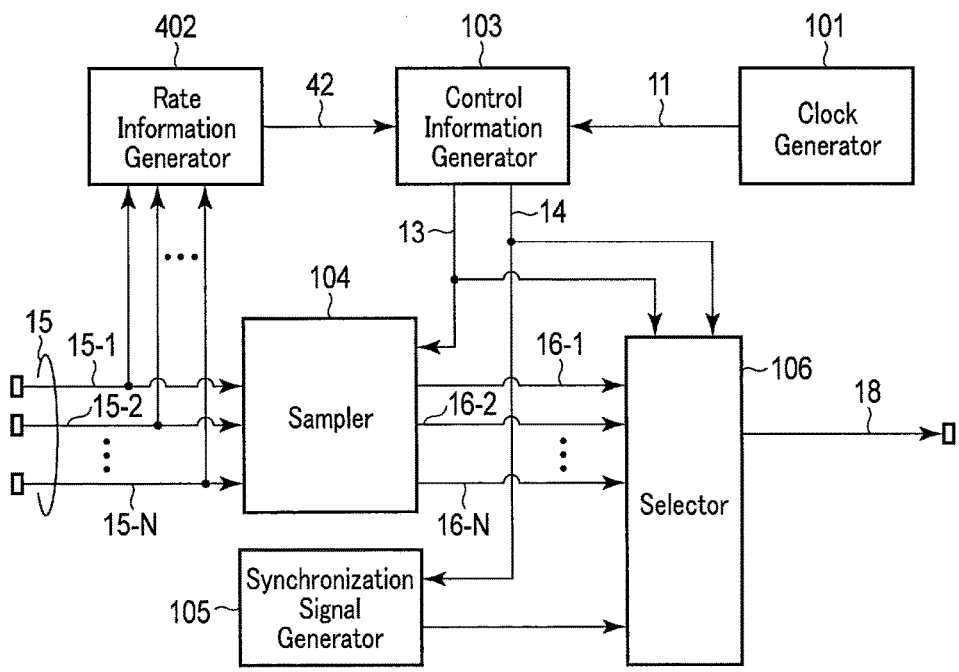
FIG. 4 is a block diagram illustrating a signal conversion apparatus according to the fourth embodiment.

The signal conversion apparatus shown in FIG. 1 may be modified as shown in FIG. 4. The signal conversion apparatus shown in FIG. 4 comprises a clock generator 101, a rate information generator 402, a control information generator 103, a sampler 104, a synchronization signal generator 105, and a selector 106. The clock generator 101, the control information generator 103, the sampler 104, the synchronization signal generator 105, and the selector 106 in FIG. 4 are the same as or similar to those in FIG. 1.

The serial signal 18 may be transmitted over a wired communication or a wireless communication. For example, the signal processing apparatus shown in FIG. 4 can further comprise a transmitter to transmit the serial signal 18 wirelessly. This additional transmitter may modulate a bit value to a radio signal using an amplitude modulation scheme, such as on-off keying.

The rate information generator 402 generates rate information 42 indicating the transmission rates of the original signals 15-1, 15-2, . . . , 15-N by analyzing them. Specifically, the transmission rates can be obtained by observing the timing of when the signal values of the original signals 15-1, 15-2, . . . , 15-N change over a certain period of time. The rate information generator 402 outputs the rate information 42 to the control information generator 103.

As explained above, the signal conversion apparatus according to the fourth embodiment generates rate information by analyzing a plurality of original signals. Therefore, with the signal conversion apparatus according to the fourth embodiment, it is possible to handle original signals having unknown transmission rates.

Fifth Embodiment

As shown in FIG. 15, the information processing apparatus 900 comprises a first information processor 901, a signal converter 902, a transmitter 903, a receiver 904, a signal restorer 905, and a second information processor 906. The transmitter 903 and the receiver 904 may be replaced with transmission lines for transmitting electric signals over a wired communication.

The first information processor 901 performs information processing to generate an original signal group including a plurality of original signals. Specifically, the first information processor 901 may be a camera module, or a processor. The original signals may be video signals or control signals, etc., for example. The first information processor 901 outputs the original signal group to the signal converter 902.

The signal converter 902 inputs the original signal group from the first information processor 901. The signal converter 902 converts the original signal group to a first serial signal. The signal converter 902 may be the same as or similar to the signal conversion apparatus shown in FIG. 1, 3, or 4. The signal converter 902 outputs a first serial signal to the transmitter 903.

The transmitter 903 inputs the first serial signal from the signal converter 902. The transmitter transmits the first serial signal wirelessly. The transmitter 903 may modulate a bit value to a radio signal using an amplitude modulation scheme, such as on-off keying.

The receiver 904 obtains a second serial signal by receiving the first serial signal wirelessly. The receiver 904 may demodulate a bit value from a radio signal using a demodulation scheme corresponding to an amplitude modulation scheme, such as on-off keying. The receiver 904 outputs the second serial signal to the signal restorer 905.

The signal restorer 905 inputs the second serial signal from the receiver 904. The signal restorer 905 converts the second serial signal into a restored signal group including restored signals. The signal restorer 905 may be the same as or similar to the signal restoration apparatus shown in FIG. 2. The signal restorer 905 outputs the restored signal group to the second information processor 906.

The second information processor 906 inputs the restored signal group from the signal restorer 905. The second information processor 906 performs information processing using the restored signal group. Specifically, the second information processor 906 may be a display module, or a control module.

As explained above, the information processing apparatus according to the fifth embodiment has a functional unit corresponding to the aforementioned signal conversion apparatus and signal restoration apparatus between the first information processor and the second information processor. In other words, according to the present information processing apparatus, it is possible to multiplex a plurality of signals exchanged simultaneously between the first information processor and the second information processor. Thus, since there is no need of providing a transmission line for transmitting the plurality of signals separately, it is easy to reduce the size of the information processing apparatus.

It should be noted that the information processing apparatus may comprise multiple pairs of the first information processor and the second information processor. Furthermore, the second information processor may have a function of generating a different original signal group, and the first information processor may have a function of receiving the different original signal group, and may perform processing using the group. In other words, the first information processor and the second information processor may transmit original signals bidirectionally.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus for transforming parallel signals to a serial signal, comprising:
    a receiver that receives a first input signal of a first bit rate and second input signal of a second bit rate lower than the first bit rate, wherein the first input signal and the second input signal are the parallel signals;
    a sampler that samples the first input signal at first timings to generate first sampled signals and samples the second input signal at second timings to generate second sampled signals; and
    an output terminal that outputs the first sampled signals at a first frequency, outputs the second sampled signals at a second frequency lower than the first frequency, and outputs synchronization signals at a third frequency, wherein the first sampled signals, the second sampled signals, and the synchronization signals are output as the serial signal, and the synchronization signals are used for determining a reference timing to restore the first input signal and the second input signal from the serial signal, and
    wherein:
    the first frequency is equal to or higher than a frequency equal to a value of the first bit rate,
    the second frequency is equal to or higher than a frequency equal to a value of the second bit rate, and
    at least one of two conditions: (a) the first frequency is higher than the frequency equal to the value of the first bit rate and (b) the second frequency is higher than the frequency equal to the value of the second bit rate, is met.

2. The apparatus according to claim 1, further comprising a clock generator that generates a clock signal using at least one of the first input signal and the second input signal.

3. The apparatus according to claim 2, wherein the clock signal is frequency-synchronized with at least one of the first input signal and the second input signal.

4. The apparatus according to claim 1, wherein a combination of the first timings and the second timings, and output timings of the synchronization signals are derivable using a symbol that repeats in a certain cycle.

5. The apparatus according to claim 1, wherein:
    a first part of the first sampled signals and the second sampled signals includes bit values obtained by sampling a second part of the first input signal and the second input signal, and
    a third part of the first sampled signals and the second sampled signals includes logically-inverted bit values of bit values obtained by sampling a fourth part of the first input signal and the second input signal.

6. The apparatus according to claim 1, further comprising a transmitter that transmits the serial signal wirelessly.

7. The apparatus according to claim 1, wherein the synchronization signal is used to synchronize a receiver of the serial signal with the apparatus.

8. The apparatus according to claim 1, wherein:
    the receiver receives a third input signal which is synchronized with one of the first input signal and the second input signal,
    the sampler samples the third input signal at third timings to generate third sampled signals, and
    the output terminal outputs the third sampled signals instead of the first sampled signals at output timings of the first sampled signals or instead of the second sampled signals at output timings of the second sampled signals.

9. The apparatus according to claim 1, wherein the third frequency is higher than the second frequency.

10. The apparatus according to claim 1, wherein a first temporal relationship among output timings of the first sampled signals, output timings of the second sampled signals, and output timings of the synchronization signals in a first cycle is identical to a second temporal relationship among output timings of the first sampled signals, output timings of the second sampled signals, and output timings of the synchronization signals in a second cycle, the first cycle being different from the second cycle, and a length of the first cycle being identical to a length of the second cycle.

11. A method for transforming parallel signals to a serial signal, the method comprising:
    receiving a first input signal of a first bit rate and a second input signal of a second bit rate lower than the first bit rate, wherein the first input signal and the second input signal are the parallel signals;
    sampling the first input signal at first timings to generate first sampled signals and sampling the second input signals at second timings to generate second sampled signals; and
    outputting the first sampled signals at a first frequency, outputting the second sampled signals at a second frequency lower than the first frequency, and outputting a synchronization signals at a third frequency, wherein the first sampled signals, the second sampled signals, and the synchronization signals are output as the serial signal, and the synchronization signals are used for determining a reference timing to restore the first input signal and the second input signal from the serial signal, and wherein:

the first frequency is equal to or higher than a frequency equal to a value of the first bit rate, the second frequency is equal to or higher than a frequency equal to a value of the second bit rate, and at least one of two conditions: (a) the first frequency is higher than the frequency equal to the value of the first bit rate and (b) the second frequency is higher than the frequency equal to the value of the second bit rate, is met.

12. The method according to claim 11, further comprising generating a clock signal using at least one of the first input signal and the second input signal.

13. The method according to claim 12, wherein the clock signal is frequency-synchronized with at least one of the first input signal and the second input signal.

14. The method according to claim 11, wherein a combination of the first timings and the second timings, and output timings of the synchronization signals are derivable using a symbol that repeats in a certain cycle.

15. The method according to claim 11, wherein:

a first part of the first sampled signals and the second sampled signals includes bit values obtained by sampling a second part of the first input signal and the second input signal, and a third part of the first sampled signals and the second sampled signals includes logically-inverted bit values of bit values obtained by sampling a fourth part of the first input signal and the second input signal.

16. The method according to claim 11, further comprising wirelessly transmitting the serial signal.

17. The method according to claim 11, wherein the synchronization signal is used to synchronize a receiver of the serial signal with a transmitter of the serial signal.

18. The method according to claim 11, further comprising:

receiving a third input signal which is synchronized with one of the first input signal and the second input signal, sampling the third input signal at third timings to generate third sampled signals, and outputting the third sampled signals instead of the first sampled signals at output timings of the first sampled signals or instead of the second sampled signals at output timings of the second sampled signals.

19. An electronic apparatus for transforming parallel signals to a serial signal, comprising:

a receiver that receives a first input signal of a first bit rate and a second input signal of a second bit rate lower than the first bit rate, wherein the first input signal and the second input signal are the parallel signals;

a sampler that samples the first input signal at first timings to generate first sampled signals and samples the second input signal at second timings to generate second sampled signals; and an output terminal that outputs the first sampled signals at a first frequency, outputs the second sampled signals at a second frequency lower than the first frequency, and outputs synchronization signals at a third frequency, wherein the first sampled signals, the second sampled signals, and the synchronization signals are output as the serial signal, and the synchronization signals are used for determining a reference timing to restore the first input signal and the second input signal from the serial signal, wherein:

the first frequency is equal to or higher than a frequency equal to a value of the first bit rate, the second frequency is higher than a frequency equal to a value of the second bit rate, a first temporal relationship among output timings of the first sampled signals, output timings of the second sampled signals, and output timings of the synchronization signals in a first cycle is identical to a second temporal relationship among output timings of the first sampled signals, output timings of the second sampled signals, and output timings of the synchronization signals in a second cycle, the first cycle being different from the second cycle, and a length of the first cycle being identical to a length of the second cycle.

* * * * *